(12) United States Patent
Almy et al.

(10) Patent No.: US 7,389,449 B2
(45) Date of Patent: Jun. 17, 2008

(54) EDGE SELECTING TRIGGERING CIRCUIT

(75) Inventors: Thomas Arthur Almy, Tualatin, OR (US); Arnold M. Frisch, Portland, OR (US)

(73) Assignee: Credence Systems Corporation, Milpitas, CA (US)

( * ) Notice: Subject to any disclaimer, the term of this patent is extended or adjusted under 35 U.S.C. 154(b) by 328 days.

(21) Appl. No.: 11/069,879

(22) Filed: Feb. 28, 2005

(65) Prior Publication Data

US 2006/0107126 A1 May 18, 2006

Related U.S. Application Data

(63) Continuation-in-part of application No. 10/954,572, filed on Sep. 30, 2004.

(51) Int. Cl.
*G11B 5/00* (2006.01)
*G11B 20/20* (2006.01)
*G06K 5/04* (2006.01)

(52) U.S. Cl. .................. 714/700; 375/226; 324/76.77
(58) Field of Classification Search .............. 714/700; 324/76.77; 375/226
See application file for complete search history.

(56) References Cited

U.S. PATENT DOCUMENTS 4,974,234 A * 11/1990 Brandt ..................... 375/226
4,975,634 A * 12/1990 Shohet ..................... 324/76.77
5,506,824 A * 4/1996 Fairchild et al. .......... 369/47.22
5,638,016 A * 6/1997 Eitrheim ................... 327/175
5,729,179 A * 3/1998 Sumi ......................... 331/12
6,404,840 B1 * 6/2002 Sindalovsky .............. 377/48
6,449,212 B1 * 9/2002 Toda et al. ................ 365/233
6,531,903 B1 * 3/2003 Wichman .................. 327/117
6,661,836 B1 * 12/2003 Dalal et al. ................ 375/226

* cited by examiner

*Primary Examiner*—Jacques Louis-Jacques
*Assistant Examiner*—Steve Nguyen
(74) *Attorney, Agent, or Firm*—Daniel J. Bedell; Smith-Hill and Bedell

(57) ABSTRACT

A triggering circuit asserts a trigger signal in response to edges of a digital signal conveying a repetitive pattern of edges. The triggering circuit generates first data having a value identifying a position within the pattern of a last occurring edge of the digital signal and generates second data having a value identifying a position of a particular edge within the pattern that is to initiate a next assertion of the trigger signal. The triggering circuit asserts the trigger signal when the first and second data values match and de-asserts the trigger signal when the first and second data do not match. In a repetitive mode of operation, the triggering circuit keeps the second data value constant so that it always asserts the trigger signal in response to the same edge of the pattern. In a sequential mode of operation, the triggering circuit changes the value of the second data each time it asserts the trigger signal so that successive assertions of the trigger signal occur in response to differing edges of the digital signal pattern.

4 Claims, 5 Drawing Sheets

_US 7,389,449 B2_

EDGE SELECTING TRIGGERING CIRCUIT

CROSS-REFERENCE TO RELATED APPLICATIONS

This application is a continuation-in-part of U.S. patent application Ser. No. 10/954,572 filed Sep. 30, 2004.

BACKGROUND OF THE INVENTION

1. Field of the Invention

The invention relates in general to timing circuits and in particular to an apparatus for generating trigger signal edges in response to selected edges of a repetitive signal pattern.

2. Description of Related Art

Digital integrated circuits (ICs) typically communicate through digital signals having edges synchronized to edges of a periodic clock signal so that state changes in the IC output signals occur at predictable times. However, most such signals exhibit some amount of variation in the timing of their edges ("jitter") with respect to the clock signal edges. "Random jitter" arises, for example, from random noise in the transmitting IC or in the signal path conveying the signal away from the IC and renders the timing of each data signal edge non-deterministic in that it is not possible for a receiving IC to predict the amount of timing error in any individual signal edge arising from random noise. "Deterministic jitter" arises mainly from frequency response characteristics of the transmitting IC and the signal path conveying the signal from the IC. For example any transmission line will delay signal edges by an amount that is a function of the path's frequency response and the signal's characteristics. When a digital data signal conveys a bit pattern such as {01010101 ... }, it will act as a relatively higher frequency signal than when it conveys a bit pattern such as {00000111110000011111 ... }. Thus the amount by which a signal path delays an edge of a digital signal at any given moment depends in part on the particular data pattern the signal currently conveys. This "pattern-dependant" jitter is deterministic in that timing error in each data signal edge due to pattern-dependant jitter for a given pattern is predictable based on the nature of the pattern and on characteristics of the hardware implementing the signal path. Deterministic jitter that is not pattern-dependant can arise, for example, from periodic noise that is coherent with the clock signal the transmitting IC uses to time edges.

Since a signal receiver usually samples a digital signal midway between edges to determine its state, it can tolerate some amount of jitter, but when a signal is too jittery, a signal receiver will not always be able to detect the correct signal state. It is therefore helpful to test ICs to determine whether their output signals exhibit an acceptably small level of jitter.

FIG. 1 illustrates prior art system for measuring the jitter of an integrated circuit device under test (DUT) 10. An IC tester 12 transmits input signals to DUT 10 causing it to produce a periodic output signal OUT. A comparator 14 compares the OUT signal to a reference voltage set to the OUT signal's logic threshold and produces an output signal COMP indicating when the OUT signal crosses the logic threshold. As illustrated in the timing diagram off FIG. 2, a time measurement unit (TMU) 16 measures the period between edges of the COMP signal and edges of a periodic timing reference signal TREF supplied by IC tester 12 and provides data indicating the results of each measurement to a data acquisition system 18. TMU 16 sends a LOAD signal to data acquisition system 18 whenever it has data for the acquisition system to store, and data acquisition system sends a trigger signal TRIG, to TMU 16 whenever it is ready for TMU 16 to make another measurement. TMU 16 responds to the TRIG signal by measuring the interval between the next COMP and TREF signal edges. FIG. 2 shows two such measurements, T1 and T2. The TREF and OUT signals are coherent so if the OUT signal has no jitter, then an edge of the TREF signal will always follow an edge of the COMP signal by a fixed amount and TMU 16 will always measure the same interval between COMP and TREF signal edges. But when the OUT signal is jittery, the period measurements will vary. When TMU 16 makes a large number of such measurements, computer 20 can analyze the resulting data stored in data acquisition system 18 to estimate signal jitter from the variation in the measurement data.

When the OUT signal is periodic and of a single frequency, the test system will be able to detect random jitter, but will not be able to detect any of the deterministic jitter that arises when the OUT signal of a varying frequency. Suppose, however, the OUT signal were periodic, but had a progressively decreasing frequency during each cycle so that signal frequency during each cycle ranges from the highest possible frequency down to DC. FIG. 3 illustrates the COMP signal output that might result from such an OUT signal. In order to properly measure the jitter of this signal, TMU 16 would have to make several period measurements of representative edges of the COMP signal at each of several frequency ranges of interest. The problem with the test system of FIG. 1 is that data acquisition system 18 asserts the TRIG signal that initiates period measurement whenever it is ready to acquire more data. Since the TRIG signal is asserted at the rate TMU 16 and data acquisition circuit 18 can acquire and store data, there is no assurance that the appropriative number of period measurements will be made at each OUT signal frequency range of interest.

What is needed is a triggering circuit for controlling the TRIG signal so that TMU 16 samples selected corresponding edges within each cycle of the COMP signal a predetermined number of times in a predetermined order. In such case, the data sequence produced by THU 16 would be ordered so that computer 20 would he able to determine the range of edge timing variation at each frequency range of interest, thereby enabling it to quantify both deterministic and nondeterministic jitter.

SUMMARY OF THE INVENTION

A triggering circuit in accordance with the invention asserts a trigger signal in response to edges of a digital signal conveying a repetitive pattern of edges. The triggering circuit generates first data having a value identifying a position within the pattern of a last occurring edge of the digital signal and generates second data having a value identifying a position of a particular edge within the pattern that is to initiate a next assertion of the trigger signal. The triggering circuit asserts the trigger signal when the first and second data values match and de-asserts the trigger signal when the first and second data do not match.

In a repetitive mode of operation, the triggering circuit holds the second data value constant so that it always asserts the trigger signal in response to the same edge of the pattern.

In a sequential mode of operation, the triggering circuit changes the value of the second data each time it asserts the trigger signal so that successive assertions of the trigger signal occur in response to differing edges of the digital signal pattern.

The claims appended to this specification particularly point out and distinctly claim the subject matter of the invention. However those skilled in the art will best understand both the organization and method of operation of what the applicant(s)

consider to be the best modes practicing the invention, together with further adverted objects of the invention, by reading the remaining portions of the specification in view of the accompanying drawing(s) wherein like reference characters refer to like elements.

DETAILED DESCRIPTION OF THE INVENTION

The invention relates to an apparatus for generating trigger signal edges in response to selected edges of a repetitive signal pattern. While the specification describes in detail an exemplary embodiment of the invention considered a best mode of practicing the invention, those of skill in the art will appreciate that other modes of practicing the invention are possible and that many implementation details of the exemplary embodiment described herein may be altered or omitted in other embodiments of the invention.

Figure 4:
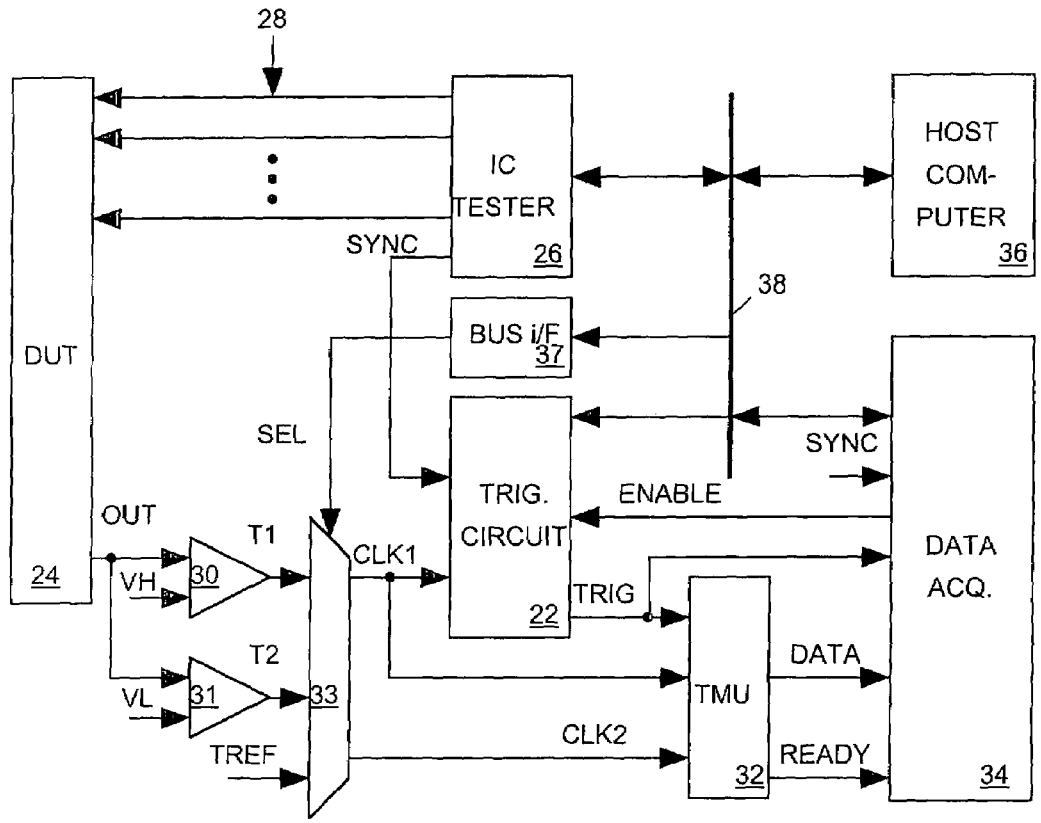
FIG. 4 is a block diagram illustrating a jitter measurement system employing a triggering circuit in accordance with the invention.
Figure 5:
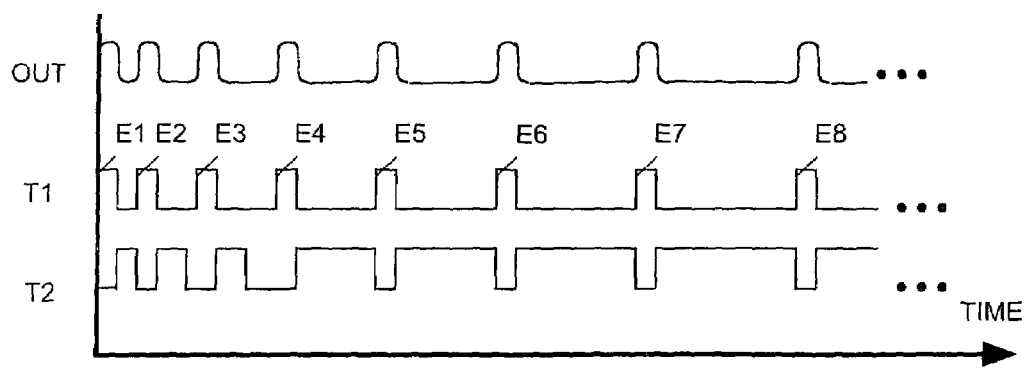
FIGS. 5-7 are a timing diagram illustrating behavior of signals of the jitter measurement system of FIG. 4.

A triggering circuit 22 in accordance with the invention is useful, for example, in the context of a system 23 as illustrated in FIG. 4 for measuring jitter in an output signal (OUT) of an integrated circuit device under test (DUT) 24. Test system 23 includes a conventional IC tester 26 for supplying input signals 28 to DUT 24 causing it to generate a repetitive pattern of edges in the OUT signal. A comparator 30 compares the OUT signal to a reference voltage VH set between the OUT signal's high and low logic levels so that edges of the comparator output signal T1 indicate when the OUT signal transitions to its high logic level. A comparator 31 compares the OUT signal to a reference voltage VL set so that edges of the comparator output signal T2 indicate when the OUT signal transitions to its low logic level. The OUT signal pattern may vary in frequency, for example starting at the highest possible OUT signal frequency at the start of each cycle of the pattern and ranging down to near DC toward the end of each cycle of the pattern. FIG. 5 shows a portion of the resulting T1 signal pattern where the period between successive leading edges E1-E8 of T1 signal pulses within each cycle of the signal pattern progressively increase as the T1 signal frequency decreases. FIG. 5 also illustrates the corresponding T2 signal pattern. Although FIG. 5 illustrates T1 and T2 signal patterns resulting from one suitable OUT signal pattern, other OUT signal patterns can be employed.

Figure 6:
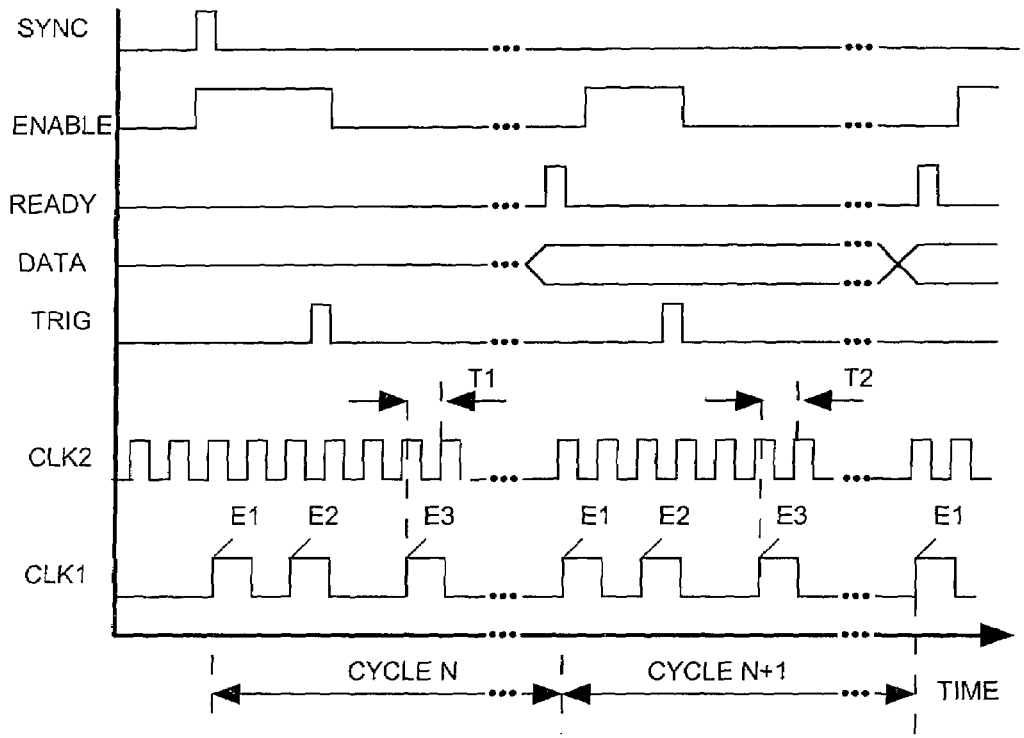

A multiplexer 33 receives the T1 and T2 signals and a timing reference signal TREF as inputs. Timing reference signal TREF may be supplied by IC tester 26 or from another source. Multiplexer 33 selects one of its three inputs as an output signal CLK1 and selects another of its three outputs as an output signal CLK2. A time measurement unit (TMU) 32 measures the delay between a selected edge of the CLK1 signal and a next succeeding edge of the CLK2 signal. FIG. 6 illustrates two such measurements when multiplexer 33 selects CLK1 as the T1 signal of FIG. 5 and selects CLK2 as the timing reference signal TREF. In this example the TREF signal, which may for example be produced by IC tester 26, and the OUT signal are coherent, with the TREF signal edges being timed such that if the OUT signal has no jitter, a leading edge of the TREF signal will always occur with the same delay following any state change in the OUT signal. With multiplexer 33 selecting T1 as CLK1 and selecting TREF as CLK2, leading edges of the CLK1 signal indicate when the OUT signal transitions to a high logic level, and a CLK2 signal edge will always occur with the same delay following an edge of the CLK1 signal, provided that the OUT signal has no jitter relative to the TREF signal. However, when the OUT signal is jittery, the delay measurements TMU 32 makes will vary because the delay between edges of the CLK1 and CLK2 signals will vary.

TMU 32 asserts a data ready signal (READY) each time it makes a delay measurement, and a data acquisition system 34 responds to the READY signal by storing the data (DATA) TMU 32 produces to indicate the results of each delay measurement. A host computer 36 programs IC tester 26 via programming instructions supplied over a computer bus 38. At the end of the test, host computer 36 acquires the measurement data from data acquisition system 34 via bus 38 and analyzes that data to estimate the amount of jitter in the OUT signal.

The invention relates in particular to triggering circuit 22, which supplies a trigger signal (TRIG) to TMU 32 to tell it when to measure the delay between a next occurring CLK1 and TRIG signal leading edges. Before the start of a test, host computer 36 supplies control data to triggering circuit 22 via bus 38 telling it the number of leading edges to be included in each cycle of the CLK1 signal. At the start of the jitter test, IC tester 26 transmits a SYNC signal pulse to triggering circuit 22 telling it when the next edge E1 of the CLK1 signal corresponds to the first edge in one of one of its repetitive pattern cycles. Triggering circuit 22 thereafter keeps track of the edges of the CLK1 signal to determine which edge of the repetitive CLK1 signal pattern will next occur. When enabled by an ENABLE signal from data acquisition circuit 34, triggering circuit 22 thereafter generates TRIG signal pulses in response to particular edges of the CLK1 signal selected in either of two modes of operation as described below. The control data supplied by host computer 36 via bus 38 before the start of the test also selects the mode in which triggering circuit 22 is to operate.

Repetitive Triggering Mode

In a "repetitive triggering" mode of operation, triggering circuit 22 always generates a TRIG signal pulse in response to the same edge of the repetitive CLK1 signal pattern. The control data from host computer 36 tells triggering circuit 22 which edge of the pattern to select. Thus, for example, host computer 36 may configure triggering circuit 22 to generate the TRIG signal only in response to the second edge E2 of the CLK1 signal pattern as illustrated in FIG. 6. In such case each TRIG signal leading edge tells TMU 32 to measure the delay between the next arriving edge (E3) of the repetitive CLK1 signal pattern and the next succeeding edge of the CLK2 signal. FIG. 6 shows two such repetitive triggering mode measurements P1 and P2 made in response to E3 edges in two cycles of the repetitive CLK1 signal pattern. Each TRIG signal pulse also tells data acquisition system 34 to turn off the ENABLE signal, thereby preventing triggering circuit 22 from asserting another trigger signal. After TMU 32 measures the period between the E3 CLK1 signal edge and the next CLK2 signal edge, it asserts the READY signal to tell data acquisition circuit 34 to acquire the data. After data acquisition circuit 34 acquires the data, it re-asserts the ENABLE signal enabling triggering circuit 22 to generate another TRIG signal edge following the next occurrence of an E2 signal edge of another cycle of the repetitive CLK1 signal pattern. Control data from host computer 35 tells data acquisition system 34 how many measurements are to be taken.

Thus in the repetitive triggering mode, triggering circuit 22 always triggers a period measurement with respect to the same edge of the pattern selected by data from host computer 36 as illustrated for example in FIG. 5. But triggering circuit 22 does not necessarily trigger a measurement on each successive cycle of the repetitive pattern as shown in FIG. 6 if the time TMU 32 and data acquisition system 34 need to acquire and store the measurement data is longer than one cycle of the repetitive pattern.

Sequential Triggering Mode

Figure 7:
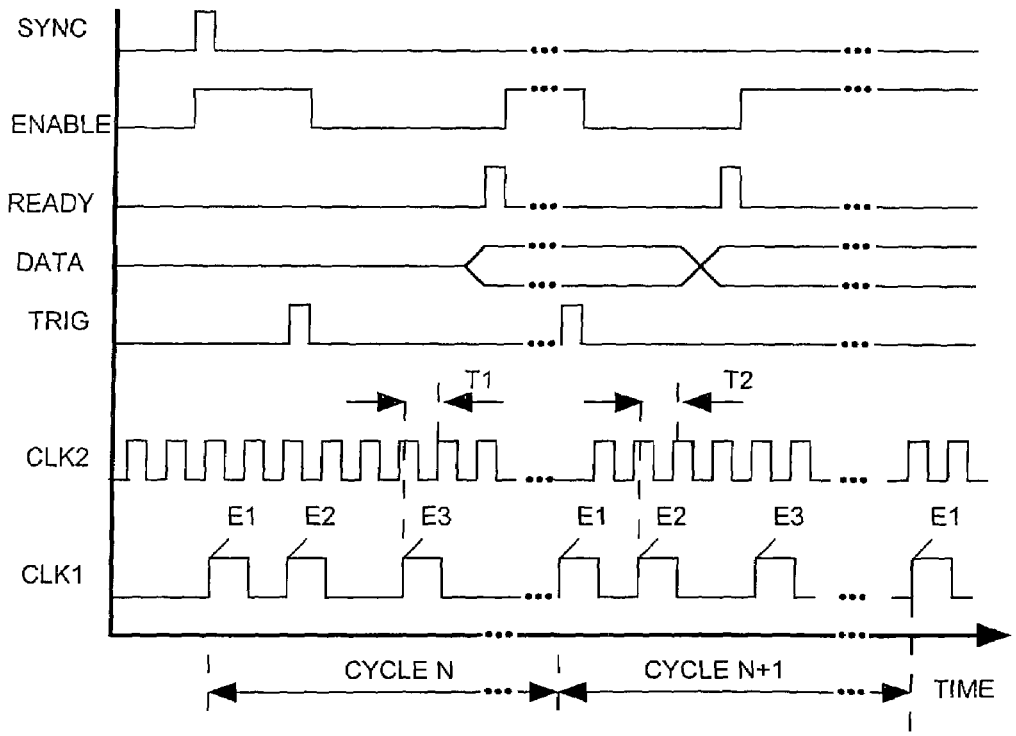

In a "sequential triggering" mode of operation, triggering circuit 22 generates successive TRIG signal pulses in response to the different edges of the repetitive CLK1 signal pattern, with pattern edges being selected in a predetermined sequential order. For example as illustrated in FIG. 7, during cycle N of the repetitive CLK1 signal pattern, triggering circuit 22 generates a TRIG pulse following edge E2 of the CLK1 signal pattern so that TMU 32 makes a first period measurement in response to edge E3 of the pattern. During cycle N+1 of the CLK1 signal pattern, triggering circuit 22 generates a TRIG signal pulse following edge E3 of the CLK1 signal pattern so that TMU 32 makes a second period measurement following edge E2 of the pattern. Assuming the pattern has, for example 1024 edges E1-E1024, this process can continue with triggering circuit 22 generating successive TRIG signal pulses following pattern edges E1, E1024, E1023, E1022, . . . so that TMU 32 makes successive period measurements after pattern edges E2, E1, E1024, E1023 . . . After J repetitions of the process, TMU 32 will have made J period measurements following each of the 1024 edges of the repetitive pattern.

Triggering Circuit Architecture

Figure 8:
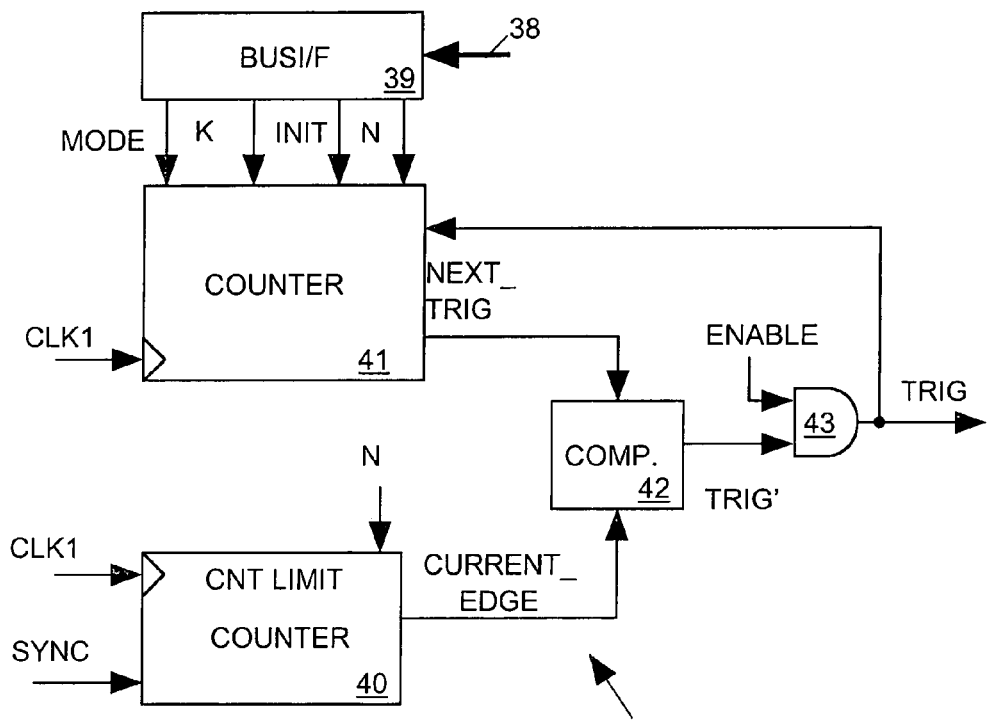
FIGS. 8 and 9 are block diagrams illustrating alternative examples of a triggering circuit in accordance with the invention.

FIG. 8 depicts an example embodiment of triggering circuit 22 of FIG. 4 in more detailed block diagram form. Before starting a test, host computer 36 supplies control data to triggering circuit 22 via bus 38 and a bus interface circuit 39. Given that the repetitive CLK1 signal pattern has leading edges numbered from 0 to N, some bits of the control data indicates the value of N. The state of a MODE bit of the control data controls whether triggering circuit 22 operates in the repetitive triggering mode or in the sequential triggering mode. The value K of other bits of the control data indicates the particular edge of the repetitive CLK1 data pattern to which triggering circuit 22 is to initiate the first TRIG signal assertion.

Triggering circuit 22 includes a pair of counters 40 and 41, a comparator 42 and an AND gate 43. Counter 40 repetitively counts edges of the CLK1 signal pattern from 0 up to N and then restarts its count. At the beginning of a test, the SYNC signal, which occurs just before the first edge of a cycle of the repetitive CLK1 signal pattern, tells counter 40 to reset its output count (CURRENT_EDGE) to 0 on the next ($0^{th}$) leading edge of the CLK1 signal. Thereafter CURRENT_EDGE repeatedly takes on all values from 0 through N as it counts each of the N edges of each cycle of the repetitive CLK1 signal pattern. The sequence of CURRENT_EDGE values can be arbitrary. For example it may be monotonically increasing, (0, 1, 2, 3 . . . N), monotonically decreasing (N, N−1, N−2, 1, 0) or in a pseudorandom order.

Counter 41 selects the edge number (NEXT_TRIG) that is to initiate the next TRIG signal edge. Comparator 42 compares NEXT_TRIG to CURRENT_EDGE, and when their values match, it drives an input TRIG' to AND gate 43 high. The ENABLE signal input from data acquisition system 34, which tells triggering circuit 22 when it may generate a TRIG signal edge, drives another input of AND gate 43. AND gate 43 asserts the TRIG signal when the ENABLE and the TRIG' signals are both asserted and otherwise de-asserts the TRIG signal. Thus when the ENABLE signal is asserted, a leading edge of the TRIG signal occurs when the number (CURRENT_EDGE) of the last occurring edge of the repetitive CLK1 signal pattern matches the TRIG_NEXT output of counter 41.

Figure 1:
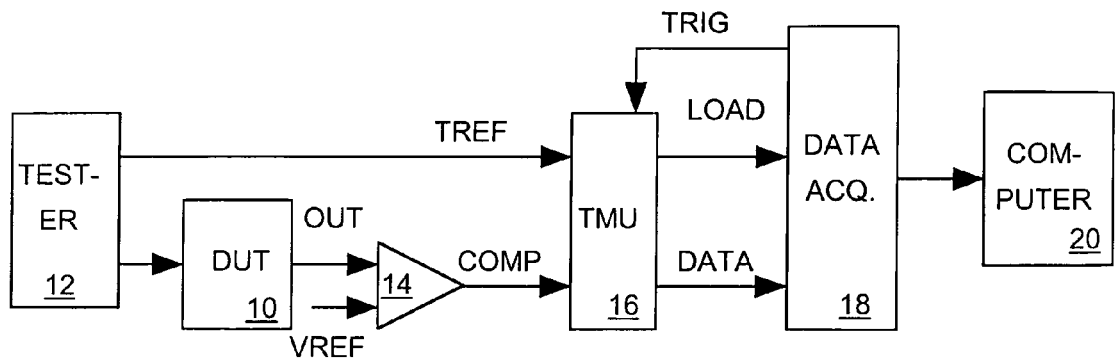
FIG. 1 is a block diagram illustrating a prior art system for measuring the jitter of an integrated circuit device under test (DUT).
Figure 2:
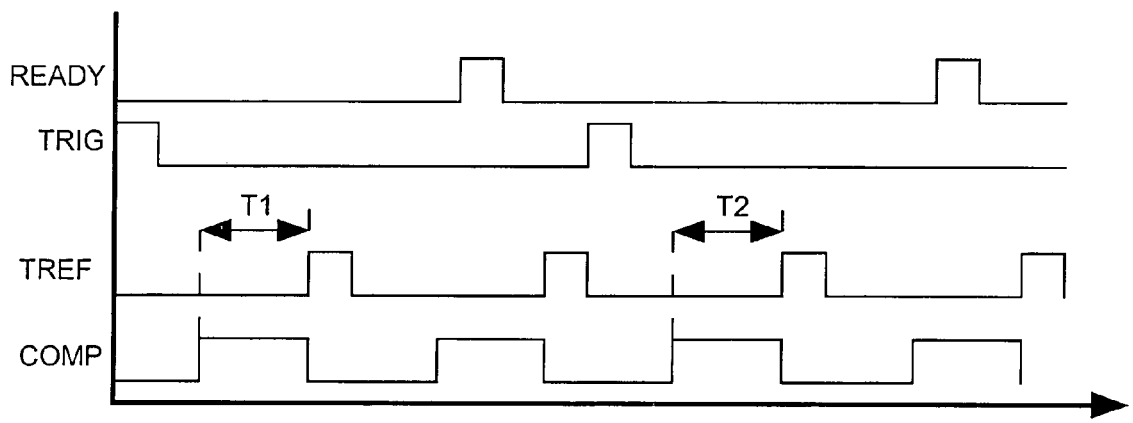
FIG. 2 is a timing diagram illustrating behavior of signals of the jitter measurement system of FIG. 1.
Figure 3:
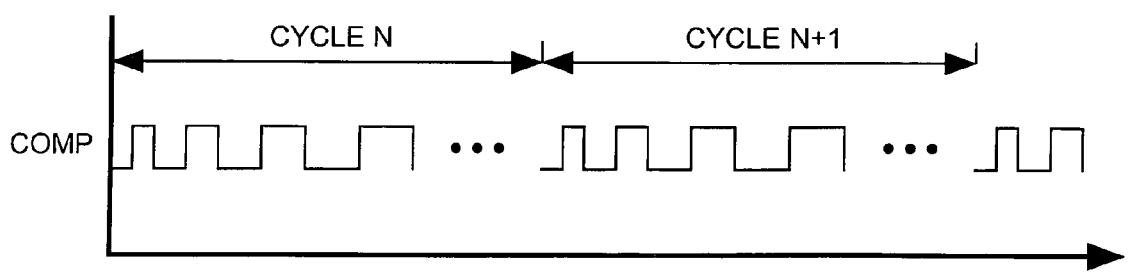
FIG. 3 is a timing diagram illustrating a digital signal having a repetitive edge pattern.

An INIT signal from host computer 36 loads the value of K into counter 41 to initially set the NEXT_TRIG value to K so that the first TRIG signal edge will occur in response to the $K^{th}$ edge of a next cycle of the repetitive CLK1 signal pattern that occurs when the data acquisition system 34 (FIG. 2) initially drives the ENABLE signal true.

When triggering circuit 22 is to operate in the repetitive triggering mode, the MODE control bit tells counter 41 to freeze its output NEXT_TRIG at the value of K. As counter 40 counts edges of the CLK1 signal, the value of CURRENT_EDGE eventual matches the value (K) of NEXT_TRIG, comparator 42 responds by driving TRIG' true. AND gate 43 then drives TRIG high to initiate the first TRIG edge. The TRIG signal is de-asserted later when data acquisition system 34 (FIG. 2) de-asserts the ENABLE signal. Counter 40 will continue to alter the value of CURRENT_EDGE on each edge of the CLK1 signal, but the TRIG signal will remain de-asserted as long as data acquisition system 34 refrains keeps the ENABLE signal low. Later, when data acquisition system 34 asserts the ENABLE signal again, comparator 42 and gate 43 will assert the TRIG signal again when CURRENT_EDGE again matches the fixed value (K) of NEXT_TRIG. Thus in the repetitive triggering mode, triggering circuit 22 will assert (generate a leading edge) of the TRIG signal on a next occurrence of the Kth edge of the repetitive CLK1 signal pattern, whenever the ENABLE signal is high.

When the MODE bit indicates triggering circuit 22 is to operate in the sequential triggering mode, counter 41 responds to each assertion of the TRIG signal by changing the value of its output NEXT_TRIG data in response to a next leading edge of the CLK1 signal. For example if counter 41 is configured to count down, it initially counts down from K to 0, and thereafter repeatedly counts down from N to 0. Thus in the sequential triggering mode, triggering circuit 22 asserts the TRIG signal in response to edges of the CLK1 signal pattern numbered in the repetitive order in which counter 41 updates its output count in response to TRIG signal assertions.

Mixed Mode

In a mixed mode of operation, host computer 36 alternately operates triggering circuit 22 in repetitive and sequential modes. Host computer 36 initially sets K to select a particular edge of the repetitive CLK1 signal pattern and sets the MODE bit so that triggering circuit 22 operates in the repetitive mode. Host computer 36 also tells data acquisition system 34 to acquire J−1 measurements of the period between that edge of the CLK1 signal pattern and the next edge of the CLK2 signal pattern. After data acquisition system 34 signals host computer 36 that it has acquired those J−1 period measurements, host computer 36 sets the MODE bit for sequential operation and configures data acquisition system 34 to acquire one period measurement. Data acquisition system 34 then acquires that next period measurement. At this point, data acquisition system 34 will have collected J period measurements of the interval between the Kth edge of the CLK1 signal pattern and the next succeeding edge of the CLK2 signal pattern. Host computer then sets the MODE bit for repetitive mode operation and tells data acquisition system 34 to collect another J−1 measurements. Following the single measurement in the sequential mode, trigger circuit 22 will have decremented NEXT_TRIG from K to K−1. The next N−1 measurements will therefore represent the period between the edge K−1 of the CLK2 signal pattern and the next succeeding edge of the CLK2 signal pattern. After those measurements are acquired, host computer 36 sets the MODE bit for sequential operation and again configures data acquisition system 34 to acquire one period measurement. Data acquisition system 34 then acquires that next period measurement. At this point, data acquisition system 34 will have also collected J period measurements of the interval between the edge K−1 of the CLK1 signal pattern and the next succeeding edge of the CLK2 signal pattern. By continuing to alternate triggering circuit 22 between the repetitive and sequential modes in this fashion, host computer 36 can cause data acquisition system 34 to collect J measurements for each of the N edges of the CLK1 signal pattern.

Programmable Triggering Circuit

Figure 9:
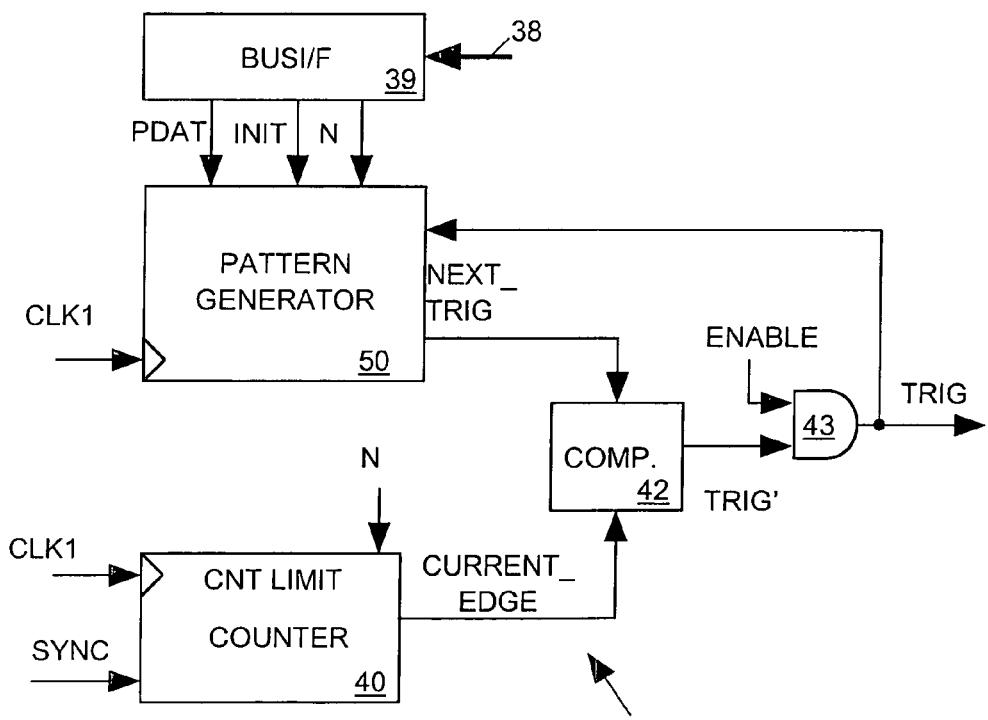

FIG. 9 illustrates an alternative embodiment of the triggering circuit 22 of FIG. 4 that is similar to that of FIG. 8 except that counter 41 is replaced with a pattern generator 50 programmed by data (PDAT) supplied by host computer via bus 38 and bus interface 39. Pattern generator 50 can be programmed to produce any desired repetitive sequence of NEXT_TRIG data values in response to successive assertions of the TRIG signal. The programming data PDAT supplied by host computer 36 determines the repetitive sequence of NEXT_TRIG data values pattern generator 50 produces. Pattern generator 50 provides more flexibility in selecting the CLK1 signal edges that are to trigger assertion of the TRIG signal than the simple counter 41 of FIG. 8.

Figure 10:
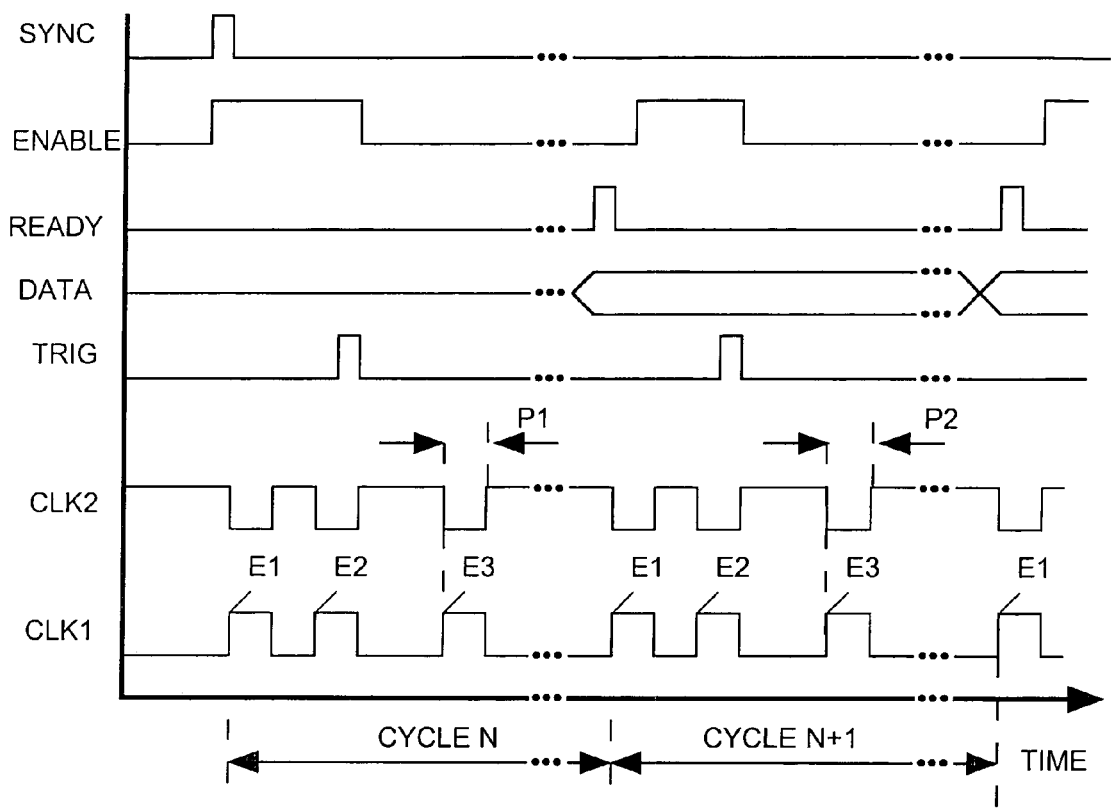
FIGS. 10 and 11 are a timing diagram illustrating behavior of signals of the jitter measurement system of FIG. 4.

In the examples of circuit operation discussed above in connection with FIGS. 6 and 7, multiplexer 33 selected the T1 signal output of comparator 30 as the CLK1 signal and selected the TREF signal as the CLK2 signal. However as mentioned above, multiplexer could select any of the T1, T2 and TREF signals as the CLK1 signal and any other of the T1, T2, and TREF signals as the CLK2 signal. For example, FIG. 10 is a timing diagram generally similar to FIG. 6 except that it illustrates signal behavior in the repetitive triggering mode when multiplexer 33 multiplexer 33 selects T1 as CLK1 and selects T2 as CLK2. Here TMU 33 repeatedly measures the period between the E3 leading edge of the CLK1 signal and the next succeeding leading edge of the CLK2 signal. Thus each measurement indicates the period between a particular leading edge of the repetitive OUT signal pattern and then next trailing edge of the OUT signal. If there were no jitter in the OUT signal, we would expect successive measurements (P1, P2 . . . ) to have the same value. The range of variation in the period measurements indicates the amount of jitter in the OUT signal.

Figure 11:
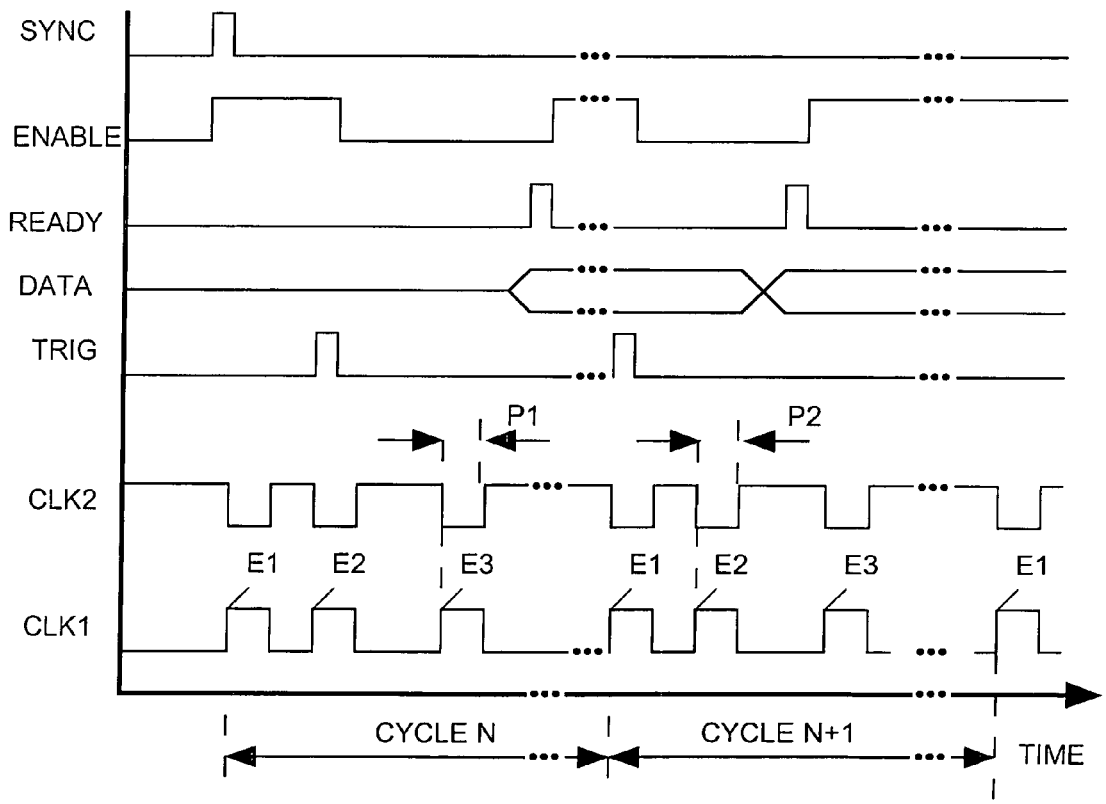

FIG. 11 is a timing diagram generally similar to FIG. 7 except that it illustrates signal behavior in the sequential triggering mode when multiplexer 33 multiplexer 33 selects T1 as CLK1 and selects T2 as CLK2. In this case TMU 32 measures the pulse width of each pulse of the CLK1 signal in turn, which is equivalent to the pulse width of each positive-going pulse of the OUT signal. If there were no jitter in the OUT signal, and all of the pulses of the OUT signal were of uniform width, we would expect successive measurements (P1, P2 . . . ) to have the same value, and the range of variation in the period measurements indicates the amount of jitter in the OUT signal. When the OUT signal pattern has N different pulse widths in the absence of jitter, we would expect each measurement (P1, P2 . . . ) to be one of N values. However when the OUT signal is jittery, the value of each measurement (P1, P2 . . . ) would fall into one of a set of N ranges where, after a sufficiently large number of measurements are made, the width of each range is indicative of the amount of jitter in the OUT signal.

Thus has been shown and described example embodiments of a triggering circuit for asserting a trigger signal in response to edges of a digital signal conveying a repetitive pattern of edges. The triggering circuit generates first data (CURRENT_EDGE) having a value identifying a position within the pattern of a last occurring edge of the digital signal and generates second data (NEXT_TRIG) having a value identifying a position of a particular edge within the pattern that is to initiate a next assertion of the trigger signal. When enabled by the ENABLE signal, the triggering circuit asserts the trigger signal when the first and second data values match and de-asserts the trigger signal when the first and second data do not match. The triggering circuit may be configured to keep the second data value constant so that it always asserts the trigger signal in response to the same edge of the pattern or may be configured to change the first data value each time it asserts the trigger signal so that successive assertions of the trigger signal occur in response to differing edges of the digital signal pattern.

The invention claimed is:

1. An apparatus for repeatedly asserting a trigger signal in response to a digital signal conveying repetitive instances of a pattern of edges, the apparatus comprising:
   a first circuit for generating first data in response to each edge of the pattern of edges, the first data having a value identifying a position of said each edge within the pattern,
   a second circuit for generating second data having a value identifying a position of a particular edge within the pattern that is to initiate a next assertion of the trigger signal, and
   a third circuit for asserting the trigger signal when the first and second data have matching values and de-asserting the trigger signal when the first and second data do not have matching values
   wherein the second circuit operates alternatively in one of sequential and repetitive triggering modes selected by input mode control,
   wherein when the second circuit operates in the sequential mode it changes the value of the second data when it asserts the trigger signal, and
   wherein when operating in the repetitive mode, the second circuit does not change the value of the second data when it asserts the trigger signal.

2. The apparatus in accordance with claim 1
   wherein when operating in the sequential mode, the second circuit changes the second data value in a repetitive pattern in response to successive assertions of the trigger signal.

3. The apparatus in accordance with claim 2 wherein each second data value of the repetitive pattern identifies a position of a separate edge of the pattern of edges of the digital signal.

4. An apparatus for repeatedly asserting a trigger signal in response to a digital signal conveying repetitive instances of a pattern of edges, the apparatus comprising:
- a first circuit for generating first data in response to each edge of the pattern of edges, the first data having a value identifying a position of said each edge within the pattern,
- a second circuit for generating second data having a value identifying a position of a particular edge within the pattern that is to initiate a next assertion of the trigger signal, and
- a third circuit for asserting the trigger signal when the first and second data have matching values and de-asserting the trigger signal when the first and second data do not have matching values,
- wherein the first circuit receives an input synchronization signal asserted when a next edge of the digital signal is a first edge of the pattern, and
- wherein the first circuit responds to assertion of the synchronization signal by setting the value of the first data to identify that next edge upon receiving that next edge of the pattern of edges in the digital signal
- wherein the first circuit comprises a counter for generating the first data as a count of edges of the digital signal,
- wherein the counter resets its count in response to assertion of the synchronization signal and also resets its count whenever the count reaches a total number of edges included in the pattern,
- wherein the second circuit operates alternatively in one of sequential and repetitive triggering modes selected by input mode control data,
- wherein when the second circuit operates in the sequential mode it changes the value of the second data when it asserts the trigger signal,
- wherein when operating in the repetitive mode, the second circuit does not change the value of the second data when it asserts the trigger signal, and
- wherein when operating in the sequential mode, the second circuit changes the second data value in a repetitive pattern in response to successive assertions of the trigger signal, wherein each second data value of the repetitive pattern identifies a position of a separate edge of the pattern of edges of the digital signal.

* * * * *